United States Patent [19]

Dias

[11] Patent Number: 4,992,692

[45] Date of Patent: Feb. 12, 1991

[54] ANNULAR ARRAY SENSORS

[75] Inventor: J. Fleming Dias, Palo Alto, Calif.

[73] Assignee: Hewlett-Packard Company, Palo Alto, Calif.

[21] Appl. No.: 352,526

[22] Filed: May 16, 1989

[51] Int. Cl.[5] .............. H01L 41/04

[52] U.S. Cl. .............. 310/335; 310/366; 310/369; 29/25.35; 73/625

[58] Field of Search .............. 73/632, 625; 310/334, 310/335, 369, 366; 29/25.35

[56] References Cited

U.S. PATENT DOCUMENTS

| | | | |
|---|---|---|---|
| 3,496,617 | 2/1970 | Cook et al. | 310/367 |
| 3,854,060 | 12/1974 | Cook | 310/367 |
| 4,537,074 | 8/1985 | Dietz | 73/625 |
| 4,628,573 | 12/1986 | Hamada et al. | 29/25.35 |

*Primary Examiner*—Hezron E. Williams
*Assistant Examiner*—Louis M. Arana

[57] ABSTRACT

An improved annular array sensor [10] that facilitates hermetic sealing and uses optimum acoustic matching layers is disclosed. The key to the performance improvement obtained in the present invention is the method of forming the annular elements [38,40] of the array. In one approach, the elements [38,40] are not quite separated from one another at the concave side [14] of the sensor shell [12]. A series of cuts [34] are made into a shell [12] of piezoelectric material from its convex side [16]. These cuts [34] are made almost entirely through the shell [12] so that a small amount of material [20] remains between the cut and the concave side [14]. After poling, the resulting ultrasonic sensor [10] has the basic electrical properties of a conventional sensor in which the cuts are made completely through the shell [12]. However, the continuous concave side [14] of the ultrasonic sensor [10] need not be sealed. A conductive coating [32] on the concave side [14] serves as a common ground for all the array elements [38,40]. In another embodiment, the concave side is grooved and plated with a conductive layer [60]. Then a series of thin-kerfed circular cuts [62] are made from the convex side [16] so that they intersect the relatively thick grooves [56]. The thick conducting layer [60] serves as both common ground and mechanical support structure. In the previous art, the conductive coating would be required to have good impedance matching properties, in addition to adequate conductivity. In either embodiment of the present invention, when an impedance matching layer [41] is selected for application to the concave side [14], no compromises need be made in its properties. Therefore the impedance match can be optimized, and the material used need not be an electrical conductor. To complete the sensor array, individal electrical conductors [42] are connected to the annuli [40] and central disc [38], at the convex side [16]. An acousitically attenuating layer [41] may be used on the convex side [16].

14 Claims, 3 Drawing Sheets

ANNULAR ARRAY SENSORS

BACKGROUND OF THE INVENTION

The present invention relates to improved methods of fabricating ultrasonic sensor arrays used to form ultrasonic images. Such sensors are used in applications such as ultrasonic, non-invasive medical imaging. The invention is particularly directed to methods of fabricating hermetically sealed sensor arrays. Arrays produced using this method will have superior acoustic performance because their impedance matching can be optimized.

An ultrasonic array works the same way a sonar system does. The major difference is that the distance from the ultrasonic array to the target is much shorter than the distance from a sonar to its target. During the transmit phase, the transducer array acts as a generator of ultrasonic energy. During the listening, or receiving, phase the transducer array acts as a sensor of reflected ultrasonic energy. In both cases, the ultrasonic array elements act as transducers. During transmission, they convert electrical energy into ultrasonic energy; during reception, they convert ultrasonic energy into electrical energy.

The ultrasonic beam is pointed in a particular direction during this transmit-receive sequence, and ultrasonic energy is received from different distances into the target in the given direction; the amount of energy received corresponds to the amount of acoustic energy reflected within the target. An ultrasonic "image" is formed by sequentially pointing the array in different directions, so that an image is built up from a large number of individual point images. Usually, the sensor is physically scanned back and forth in two directions, thereby performing a "2-sector scan" usually at a rate of about 10 Hertz, corresponding to twenty sector scans per second.

An ultrasonic point image of an object or target, such as an organ within the human body, is formed by sending out one or more pulses of ultrasonic energy from an ultrasonic array, so that the pulses are coupled into the object. The ultrasonic array then "listens" for echoes from within the object. Echoes occur at any location where there is a change in the object's acoustic properties. A change occurs wherever the velocity of sound changes. Such a change in sound velocity is referred to as a change in "acoustical impedance". The acoustic impedance changes, for example, at the interface between blood and soft tissue. Acoustical impedance changes are necessary if ultrasonic imaging is to occur, because without acoustical impedance changes there would be no change in reflected energy and hence no image formed.

However, large acoustical impedance mismatches close to the ultrasonic array are undesirable. Acoustical impedance mismatches at the transmitter or receiver reduce the amount of energy transmitted into the "target" or received back from the target. Without "impedance matching" the sensor array to the object, only a small fraction of the ultrasonic energy generated will pass into the target. Similarly, without impedance matching, only a small fraction of the energy returned from the target will be received by the sensor array.

Thus, in order to efficiently couple ultrasonic energy into the object being imaged, such as the human body, the impedance of the array and the object must be closely matched. Impedance matching requires that the velocity of the acoustic energy undergo a gradual change, rather than an abrupt change. The impedance matching is done by means of special coatings placed on the sensor array.

For example, in order to facilitate impedance matching between the ultrasonic array and the human body, the transducer is mounted inside a flexible liquid filled container with an acoustic window, and the window is placed against the body. The liquid and the flexible container provide a good impedance match to the human body, while the array can be mechanically scanned inside the liquid. The array is impedance matched to the liquid in the container by one or more layers of impedance matching material bonded to the concave face of the array.

In order to focus the ultrasonic energy, sensors are usually designed in the form of a circular section cut from a thin spherical shell. The energy is emitted from, and received at, the concave surface of the shell. Such a shape has a natural focus at the center of curvature of the spherical shell. In order to maximize performance during reception, the sensor system may be fabricated as an array of small sensors. One widely used design forms a number of annuli from the spherical shell. The return signal at each of the annuli arrives at a slightly different time, and the separate signals can be processed so as to optimize image quality. This type of sensor, called an annular array sensor, is the subject matter of this patent application.

Since ultrasonic energy would be radiated from, and received from, both the concave (desired) side and the convex (undesired) side, the coupling of the convex side must be minimized. This is done by providing an acoustically attenuating layer, an acoustic backing, at the convex side of the array.

In present designs, the acoustic backing also serves as the mechanical structure holding the separate annuli together. The fabrication starts with a shell of piezoelectric material cut from a spherical shell. Individual electrical connectors are attached to the convex surface of the shell at the locations where the annuli will be located. The attenuating acoustic backing is then applied over the convex surface. The acoustic backing must be strong enough to hold the sensor elements together. The acoustic backing also encapsulates the electrical connectors at their point of attachment.

The sensor is then formed into an annular array sensor. The spherical shell is cut into annuli using a set of ganged "hole saws". The cuts are made from the concave surface and are made just deep enough to contact the acoustic backing.

Thus there are two major requirements for an ultrasonic transducer array: the array it must be hermetically sealed so that it can function immersed in liquid, and its concave side must be efficiently impedance matched to the immersion medium, which usually has an acoustic impedance similar to that of water.

As previously described, in the present state of the art, the array is formed by cutting a piezoelectric shell into concentric annuli. The cuts are made right through the shell, all the way from the concave surface to the convex surface using a "hole saw". Thus the array consists of a set of separate concentric annuli, and one central disc.

All these elements must be mounted rigidly together to form an array, a separate wire lead must be connected to the convex side of each element, and a ground lead must be connected to the concave side of all the elements. In addition, the array must be hermetically sealed, since liquid inside the array would disrupt the proper operation of the array. It is further necessary to provide a good impedance matching coating on the concave face of this array.

In the present state of the art, the first coating applied to the concave side of the array must meet three separate requirements:

a. It must be a good electrical conductor.
b. It must form a hermetic seal to the piezoelectric elements.
c. It must have good acoustical impedance characteristics.

These requirements are in conflict with one another; there is no single material which can meet all three requirements well. Graphite is probably the best material known; yet graphite has a number of deficiencies: its impedance is not optimum, it is difficult to hermetically seal the bond between graphite and the piezoelectric material, and it is fragile.

There is a strongly felt need in this industry for an ultrasonic transducer array which can simultaneously provide mechanical integrity, a hermetic seal, and good impedance matching to water, with no compromise of electrical or mechanical performance.

SUMMARY OF THE INVENTION

The annular array sensor disclosed and claimed in this patent application overcomes the problems of fluid leakage and poor impedance matching encountered in present annular sensor arrays. The key to the improved performance achieved by the present invention is the novel method for fabricating a sensor array. The array is fabricated so that the active concave surface is tightly sealed and coated with a conductive layer. Two approaches are described: in the first, the array is formed by slicing into the piezoelectric shell from the convex side, so that the slices do not quite break through the concave output side of the array. In the second approach, the concave side is bonded together by a layer of conducting material, such as copper, having an acoustic impedance similar to that of the piezoelectric array elements. This conducting layer is so tightly bonded to each of the elements of the array that the resulting bond is hermetically sound.

The result of the first approach is an array formed from one piece of piezoelectric material which is almost sliced into a central disc surrounded by concentric annuli. Viewed from the convex side, the piezoelectric element would appear essentially identical to the array fabricated using the existing art. Viewed from the concave side, it appears to be continuous and sealed. Thus no special consideration need be given to sealing the concave side of the array. Then a conducting layer is applied, covering the concave side, to serve as a common ground for all elements of the array.

The result of the second approach is that the concave side of the array appears as a continuous copper layer which is hermetically sealed. to the concave side of the piezoelectric sensor material. Whichever approach is used, separate impedance matching coatings can be applied to the concave surface without requiring that these separate coatings provide a hermetic seal.

Typically such coatings are required to provide impedance matching between the array and water. The coating can be chosen to have optimum impedance matching properties. No consideration need be given to its electrical properties, since optimum electrical conductivity is provided by a separate coating.

Hermetic sealing in this invention is required at the convex side of the array, where an electrical connection is made to each of the separate elements of the array. Because there is no requirement for impedance matching at the convex side, the hermetic seal can be made using standard sealing techniques.

A particular value of the invention is in the fact that the sensor arrays produced using this invention will be substantially more reliable than those produced using the present state of the art. Failure due to fluid leakage, which is now common, will be eliminated. Medical applications of ultrasonic imaging often involve life-threatening situations, therefore the increased reliability of sensor arrays using the present invention will translate directly into lives saved.

An appreciation of other aims and objectives of the present invention and a more complete and comprehensive understanding of this invention may be obtained by studying the following description of a preferred embodiment and by referring to the accompanying drawings.

BRIEF DESCRIPTION OF THE DRAWINGS

FIG. 6 also shows how the individual lead wires penetrate the sealing cap.

DESCRIPTION OF THE PREFERRED EMBODIMENT

Figure 1:
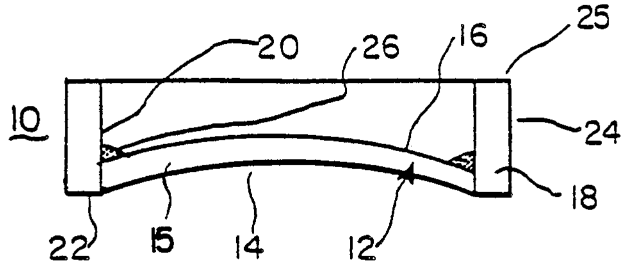
FIG. 1 is a sectional side view of the ultrasonic sensor array, following completion of the first fabrication step, in which the piezoelectric shell has been attached to a mounting ring.

FIG. 1 is an cross-sectional view of a shell of piezoelectric material 12, and a ring of conducting material 18, which are being fabricated into an annular array sensor 10. The shell 12 is shaped like a section sliced from a spherical shell, and it has a concave surface 14, a convex surface 16, and a shell edge 15. The ring 18 has an inner side 20, a bottom edge 22, an outer side 24, and a top edge 25. As shown in FIG. 1, the first fabrication step is the fastening of the piezoelectric shell to the ring by a reflow solder bead 26.

Figure 2:
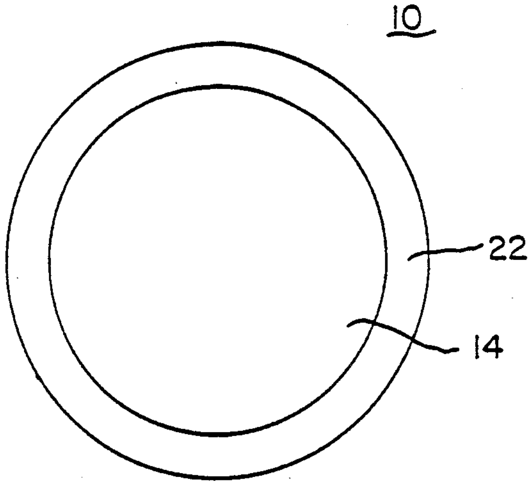
FIG. 2 is a bottom view of the array, in the same stage of fabrication as in FIG. 1.

FIG. 2 is a bottom view of the piezoelectric shell 12 and the conducting ring 18, fastened together as in FIG. 1.

Figure 3:
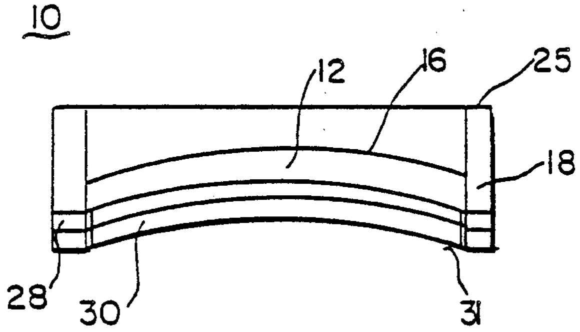
FIG. 3 is a sectional side view after a thin bonding layer has been attached to the concave surface of the piezoelectric material and to the bottom edge of the ring.

FIG. 3 illustrates the second step in fabricating the annular array sensor. A layer of chromium 28, about 200 Angstroms thick, is vacuum deposited onto the concave surface 14, the convex surface 16, and the lower edge 22 of the ring 18, and bonds tightly to all three surfaces. A layer of gold 30, about 3000 Angstroms thick, is then vacuum deposited on the chromium layer 28. The two layers together bond firmly to the concave surface 14, the convex surface 16, and the lower edge 22, of the ring 18. There may be a small gap 31 between the piezoelectric material 12 and the ring 18 following completion of this step.

Figure 4:
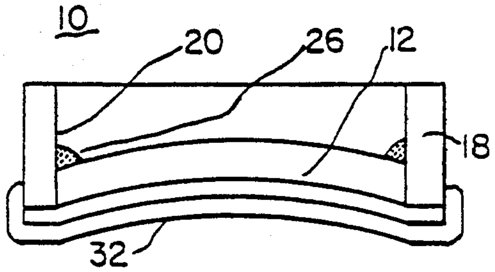
FIG. 4 is a sectional side view after a conductive layer has been attached to the thin bonding layer on the concave surface of the piezoelectric material and on the bottom edge of the ring.

FIG. 4 illustrates the next fabrication step, in which a layer of copper 32, about 0.002 inches thick, is electroplated over the gold layer 30. The copper will close the gap 31, if one occurred. The copper layer 32 is shown in its preferred configuration, plated across the ring's bottom edge 22 and onto the outer side of the ring 24.

Figure 5:
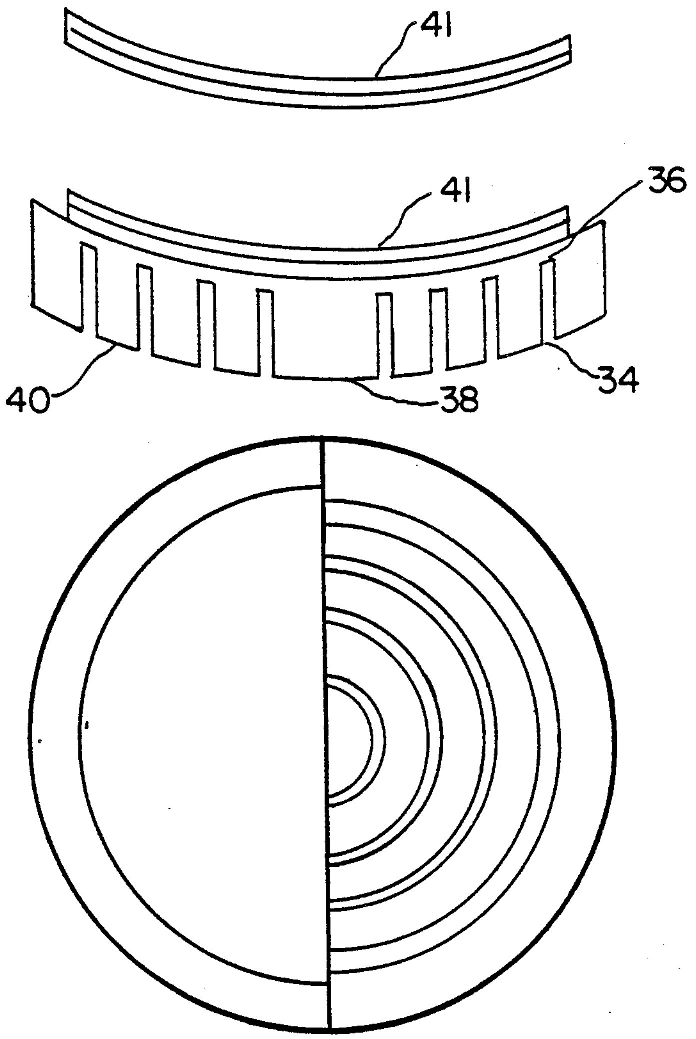
FIG. 5 shows the piezoelectric shell, without the ring, in which a series of annular cuts have been made from the convex side, almost all the way through the shell to the concave side. The left side of the plan view is the view from the concave side; the right side is the view from the convex side.

In FIG. 5 the piezoelectric shell is illustrated alone, without showing the ring 18, during the next fabrication step. Slots 34 are cut into the concave surface 14 and the convex surface 16 of the shell 12, so that each slot extends almost to the concave surface 14. Enough material 36 is left between each slot 34 and the concave surface 14, to provide physical integrity to the assembly. The resulting structure consists of a central disc 38 and a number of annuli 40, connected together by a thin layer of piezoelectric material.

FIG. 5 also illustrates application of impedance matching layers 41 to the copper layer 32, which is plated onto concave surface 14.

Figure 6:
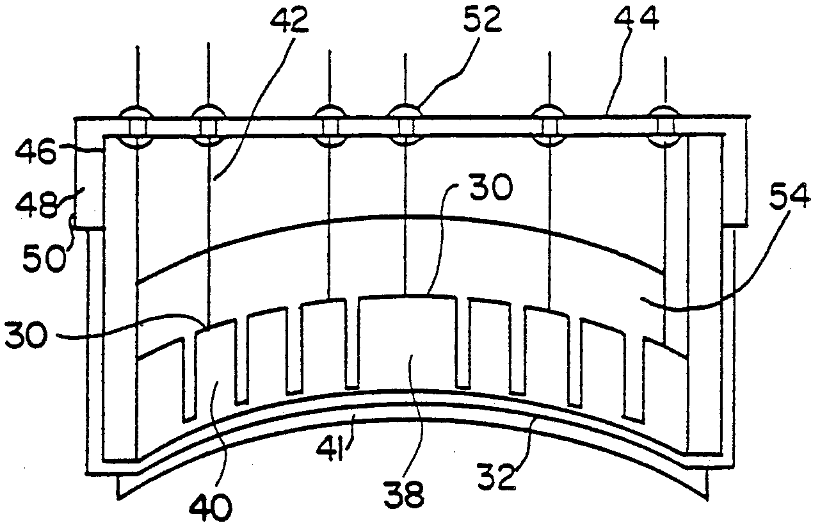
FIG. 6 shows how individual lead wires are attached to each element of the ultrasonic array at the convex side of the shell, and how a sealing cap is attached across the top edge of the ring, so that the convex side of the sensor array is hermetically sealed.

FIG. 6 illustrates the sensor assembly 10, with individual conductors 42 and a seal 44 added. An individual conductor 42 is attached to the gold layer 30 on the convex surface 16 of central disc 38 and to the gold layer 30 on the convex surfaces 16 of each of the annuli 40. The disc 38 and annuli 40 are then poled by applying a DC potential between the conductive layer 32 and each of the conductors 42.

The seal 44 is a cup shaped membrane, extending over the ring's outer side 24. The seal membrane is shown as being of sandwich construction, having an inner conductive layer 46, a central non-conductive layer 48, and an outer conductive layer 50. In practice, the seal may be lacking either inner conductive layer 46, or outer conductive layer 50. Either or both of the inner conductive layer 46 and the outer conductive layer 48 may wrap completely around the ring's top edge 25 and be joined electrically to the outer side 24 of conductive ring 18, thereby forming an electromagnetic shield around the entire sensor assembly 10.

Photolithographic techniques may be used to fabricate hermetically sealed pass-throughs 52 which are used to bring the conductors 42 to the exterior of the seal 44. The space between the seal 44 and the convex surface 16 may be partially or completely filled with a layer of acoustically attenuating material 54. Unlike present sensor designs in which a layer of acoustically attenuating material 54 is needed to mechanically support seperate annuli 40, the layer of acoustically attenuating material 54 may be left out. Operating without a layer of acoustically attenuating material 54, results in an "air-backed" sensor which is capable of greater ultrasonic output.

The resulting annular array sensor 10 is hermetically sealed on all sides. The acoustic matching layers 41 can be optimized for acoustic matching, since they have no mechanical support function or sealing function.

DESCRIPTION OF AN ALTERNATIVE EMBODIMENT

Fabrication of the the alternative embodiment starts the same way as the previously described "Preferred Embodiment". A conducting ring 18 and a piezoelectric shell 12 are assembled as shown in FIGS. 1 and 2.

Figure 7:
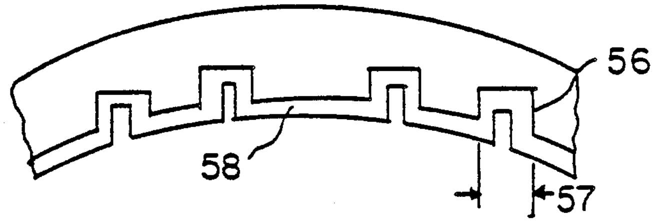
FIG. 7 is an illustration of the first step in fabricating an alternative embodiment. Relatively wide, shallow grooves are cut into the concave side of the piezoelectric shell, and a thin layer of chromium is deposited over the grooved concave surface and the lower edge of the ring, followed by a somewhat thicker layer of gold. These layers constitute a bonding layer which bonds tightly to the piezoelectric material of the shell.

The next step in fabrication of the alternative embodiment is as shown in FIG. 7. FIG. 7 illustrates a section of the piezoelectric shell 12, without showing ring 18. A series of shallow grooves 56, are cut into the concave surface 14. Each groove 56 has a width dimension 57 of about 0.012 inches and a depth dimension 59 of about 0.005 inches. The grooved concave surface 14 and convex surface 16 are then vacuum desposited with a thin layer of chromium, and a thin layer of gold 58, the chromium being about 200 Angstroms thick, and the gold about 3000 Angstroms.

Figure 8:
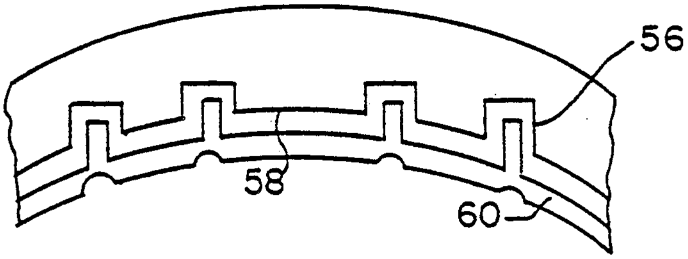
FIG. 8 shows how a relatively thick conducting layer of copper is deposited over the thin bonding layer. This conducting layer fills the grooves, and covers the concave surface of the shell and the the bottom edge of the ring.

Then, as shown in FIG. 8, a thick layer of copper 60 is electroplated over the gold layer 58, so that the copper layer 60 completely fills each of the grooves 56 and extends several thousandths of an inch above the concave surface 14. The resulting thick ring of copper 60 in the groove 44 provides physical integrity to the assembly and holds the central cylinder 38 and all the annuli 40 in rigid alignment to one another. This alternative embodiment differs from the "Preferred Embodiment" in that the disc 38 and annuli 40 are connected together by the copper ring 60 in groove 56, rather than by the thin layer 36 of piezoelectric material shown in FIG. 5.

Figure 9:
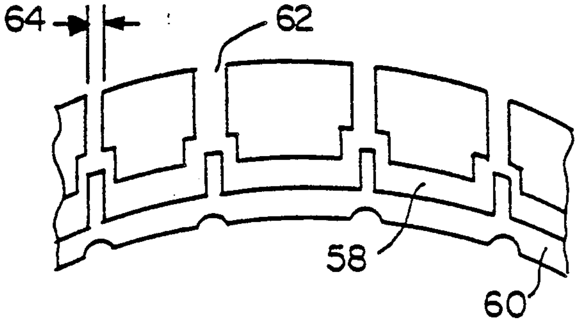
FIG. 9 shows how the annuli are separated by cutting a series of thin slots from the convex side, aligned with the grooves. The thin slots are cut just deep enough to contact the copper-filled grooves, thereby removing all the piezoelectric material from between the annuli.

In the next step, shown in FIG. 9, slots 62 are cut into the convex surface 16, in alignment with grooves 56. Each slot 62 is cut just deep enough to contact the shallow copper-filled groove 56. Slot 62 has a kerf width 64 which is smaller than the groove width 57. Thus all the piezoelectric material between the central disc 38 and each of the annuli 40 is removed.

The copper layer 60 functions as a common electrical ground, just as the conducting layer 32 does in the preferred embodiment. From this point on, the fabrication procedure follows that of the "Preferred Embodiment", once the annuli have been separated.

Impedance matching layers 41 are applied to the copper layer 60 on convex surface 14, as shown in FIG. 5.

Following the procedure in the preferred embodiment, as shown in FIG. 6, an individual conductor 42 is attached to the central disc 38 and to each of the annuli 40, on the convex surface 16. The disc 38 and annuli 40 are poled by applying a DC potential between the conductive layer 60 and each of the conductors 42.

The seal 44 is a cup shaped membrane, extending over the ring's outer side 24. The seal membrane is shown as being of sandwich construction, having an inner conductive layer 46, a central non-conductive layer 48, and an outer conductive layer 50. In practice, the seal may be lacking either inner conductive layer 46, or outer conductive layer 50. Either or both of the inner conductive layer 46 and the outer conductive layer 48 may wrap completely around the ring's top edge 25 and be joined electrically to the outer side 24 of conductive ring 18, thereby forming an electromagnetic shield around the entire sensor assembly 10.

Photolithographic techniques may be used to fabricate hermetically sealed pass-throughs 52 which are used to bring the conductors 42 to the exterior of the seal 44. The space between the seal 44 and the convex surface 16 may be partially or completely filled with a layer of acoustically attenuating material 54. If no acoustically attenuating material is applied, the result is an "air-backed" sensor.

The resulting annular array sensor 10 is hermetically sealed on all sides. The acoustic matching layers 41 can be optimized for acoustic matching, since they have no mechanical support function or sealing function.

The annular array sensor provides a high performance sensor array for use in medical ultrasonic imaging; it may also be used to great advantage in other ultrasonic imaging applications such as non-destructive testing of critical equipment. In the preferred embodiment, the piezoelectric material is chosen from the group comprising lead zirconate titanate (PZT) and modified lead titanate ($PbTiO_3$). This invention constitutes a major step forward in the continually evolving field of ultrasonic imaging.

Although the present invention has been described in detail with reference to a particular preferred embodiment and an alternative embodiment, persons possessing ordinary skill in the art to which this invention pertains will appreciate that various modifications and enhancements may be made without departing from the spirit and scope of the claims that follow.

What is claimed is:

1. A method of fabricating an ultrasonic sensor array comprising the steps of:

a. fabricating a circular shell of piezoelectric material, said shell having a concave side, a convex side, and a shell edge;

b. attaching said shell snugly inside a conductive ring, said ring having an inner side, a bottom edge, an outer side, and a top edge, so that said concave surface is aligned with said bottom edge;

c. cutting at least one circular concentric cut into said convex side; said cut extending almost to said concave side, so that a portion of said shell in proximity to said concave remains uncut;

d. forming a central disc and at least one concentric annulus, said uncut portion having a thickness dimension which is adequate to retain stable alignment between said concentric annulus and said central disc;

e. attaching a conductive coating to said concave side, to said convex side, and to said bottom edge;

f. connecting a conductor to said central disc and to each of said annuli at said convex side;

g. poling each of said annuli and said central disc by applying a DC potential between said conductive coating and each of said conductors; and h. sealing said top edge with a hermetic seal so that said convex side is sealed and each of said conductors emerges through said seal.

2. A method of fabricating an ultrasonic sensor array [10] as in claim 1, comprising the additional step of affixing a layer [41] having an acoustic matching impedance over said conductive coating [32].

3. A method of fabricating an ultrasonic sensor array [10] as in claim 2, comprising the additional step of affixing an acoustically attenuating layer [41] to said convex side [16].

4. An ultrasonic sensor array [10] comprising:

a. a piezoelectric shell [12] having a concave side [14], a convex side [16], and a shell edge [15];

b. said convex side [16] being dissected into a central disc [38] and at least one concentric annulus [40] by at least one circular cut, [34], said cut [34] extending from said convex side [16] toward said concave side [14], so that a region [36] in proximity to said concave side [14], so that a region [36] in proximity to said concave side [14] remains uncut;

c. a conductive ring [18], having an outer edge [24], an inner edge [20], a lower end [22], and an upper end [25], said ring [18] being affixed around said piezoelectric shell [12] so that said piezoelectric shell [12] fits snugly inside said ring [18], with said lower end [22] aligned with said concave side [14];

d. a conductive coating [32] applied over said concave side [14] and said lower end [22];

e. a seal [44] applied over said upper end [25] of said ring [18], thereby forming an open space [54], between said seal [44] and said convex side [16], said open space [54] being hermetically sealed; and f. an electrical connection [42] to said central disc [38] and to each of said concentric annuli [40]; said electrical connections [42] being made within said open space [54], at said convex side [16] of said piezoelectric shell [12], said connections [42] passing through said seal [44] to permit external connection.

5. An ultrasonic sensor array as in claim 4, in which said piezoelectric material is chosen from the group comprising lead zirconate titanate [PZT] and modified lead titanate ($PbTiO_3$).

6. An ultrasonic sensor array as in claim 5, in which at least one impedance matching layer [41] is bonded to said conductive coating [32] on said concave side [14].

7. An ultrasonic sensor array as in claim 6, in which said conductive coating [26] extends across said bottom edge [22], and over said outer side [24].

8. An ultrasonic sensor array as in claim 7, in which said seal [44] is a cup shaped membrane affixed to said top edge [25] of said ring [18], said seal [44] having a non-conducting layer [48], and at least one conductive layer [46,50]; said seal [44] thereby enclosing said convex side [16]; said conductive layer [46,50] extending over said outer side [24] of said ring [18]; said conductive layer [46,50] being hermetically bonded to said outer side [24].

9. An ultrasonic sensor array as in claim 8, in which said membrane is penetrated by pass-throughs [52] for said conductors [42], said pass-throughs [42] being hermetically sealed in said non-conducting central layer [48].

10. An ultrasonic sensor array as in claim 9, in which said passthroughs [42] are formed photolithographically.

11. An ultrasonic sensor array as in claim 10, in which an acoustically attenuating layer [54] is applied to said convex side [16].

12. A method of fabricating an ultrasonic sensor array comprising the steps of:

a. fabricating a shell of piezoelectric material; said shell being essentially round, and having a concave side, a convex side and a shell edge;

b. cutting at least one circular groove into said concave side, concentric with a center of said shell, said groove have a groove width;

c. depositing a conductive coating over said concave side of said array, said coating essentially filling said circular groove;

d. cutting at least one circular concentric cut into said convex side; said cut having a radius the same as that of said circular groove, and kerf width narrower than that of said groove width, said cut being aligned radially with said circular groove;

e. extending said cut to contact said conductive coating in said circular groove, thereby forming a central disc and at least one annulus which are separated from one another and maintained in position by said conductive coating;

f. attaching a conductor to said central disc and to each of said annuli at said convex side;

g. poling each of said annuli and said central disc by applying a DC potential between said conductive coating and each of said conductors; and h. sealing said top edge with a hermetic seal, so that said convex side is sealed and each of said conductors emerges through said seal.

13. A method of fabricating an ultrasonic sensor array [10] as in claim 12, comprising the additional step of affixing a layer [41] having an acoustic matching impedance over said conductive coating [60].

14. A method of fabricating an ultrasonic sensor array [10] as in claim 13 comprising the additional step of affixing an acoustically attenuating layer [41] to said convex side [16].

* * * * *